(12) United States Patent
Yeh et al.

(10) Patent No.: US 9,190,535 B2
(45) Date of Patent: Nov. 17, 2015

(54) BOOTSTRAP MOS FOR HIGH VOLTAGE APPLICATIONS

(71) Applicant: Taiwan Semiconductor Manufacturing Company, Ltd., Hsin-Chu (TW)

(72) Inventors: Jen-Hao Yeh, Kaohsiung (TW); Chih-Chang Cheng, Hsin-Chu (TW); Ru-Yi Su, Kouhu Township (TW); Ker Hsiao Huo, Taichung (TW); Po-Chih Chen, Hsin-Chu (TW); Fu-Chih Yang, Fengshan (TW); Chun-Lin Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/265,721

(22) Filed: Apr. 30, 2014

(65) Prior Publication Data

US 2014/0231884 A1  Aug. 21, 2014

Related U.S. Application Data

(63) Continuation-in-part of application No. 14/166,475, filed on Jan. 28, 2014, which is a continuation of application No. 13/481,462, filed on May 25, 2012, now Pat. No. 8,704,279.

(51) Int. Cl.
*H01L 29/80* (2006.01)
*H01L 29/808* (2006.01)
(Continued)

(52) U.S. Cl.
CPC ............ *H01L 29/808* (2013.01); *H01L 27/088* (2013.01); *H01L 29/0692* (2013.01); *H01L 29/404* (2013.01); *H01L 29/66901* (2013.01); *H01L 27/098* (2013.01)

(58) Field of Classification Search
USPC ........... 257/256, 287, 504, E27.148, E29.314
See application file for complete search history.

(56) References Cited

U.S. PATENT DOCUMENTS 5,973,341 A   10/1999  Letavic et al.
6,433,374 B1   8/2002  Fukunaga et al.
(Continued)

FOREIGN PATENT DOCUMENTS

JP  2010284731  12/2010
KR  20090070783   7/2009
(Continued)

OTHER PUBLICATIONS

Appels, J.A. "Thin Layer High-Voltage Junction FET (Resurf JFET)," IEEE Electron Device Letters, vol. EDL-2, No. 2, Feb. 1981, 3 pages.

(Continued)

*Primary Examiner* — Timor Karimy
(74) *Attorney, Agent, or Firm* — Slater & Matsil, L.L.P.

(57) ABSTRACT

A device includes a p-well region, and a first High-Voltage N-type Well (HVNW) region and a second HVNW region contacting opposite edges of the p-well region. A P-type Buried Layer (PBL) has opposite edges in contact with the first HVNW region and the second HVNW region. An n-type buried well region is underlying the PBL. The p-well region and the n-type buried well region are in contact with a top surface and a bottom surface, respectively, of the PBL. The device further includes a n-well region in a top portion of the p-well region, an n-type source region in the n-well region, a gate stack overlapping a portion of the p-well region and a portion of the second HVNW region, and a channel region under the gate stack. The channel region interconnects the n-well region and the second HVNW region.

20 Claims, 15 Drawing Sheets

(51) Int. Cl.
*H01L 29/40* (2006.01)
*H01L 29/66* (2006.01)
*H01L 29/06* (2006.01)
*H01L 27/088* (2006.01)
*H01L 27/098* (2006.01)

(56) References Cited

U.S. PATENT DOCUMENTS

| | | | |
|---|---|---|---|
| 7,605,428 B2 | 10/2009 | Williams et al. | |
| 7,737,526 B2 | 6/2010 | Williams et al. | |
| 2008/0074908 A1 | 3/2008 | Chang et al. | |
| 2014/0139282 A1 | 5/2014 | Yen et al. | |

FOREIGN PATENT DOCUMENTS

| | | |
|---|---|---|
| TW | 200816475 | 4/2008 |
| TW | 200847330 | 12/2008 |

OTHER PUBLICATIONS

Liaw, Chorng-Wei et al., "Pinch-Off Voltage-Adjustable High-Voltage Junction Field-Effect Transistor," IEEE Electron Device Letters, vol. 28, No. 8, Aug. 2007, 3 pages.

BOOTSTRAP MOS FOR HIGH VOLTAGE APPLICATIONS

PRIORITY CLAIM AND CROSS-REFERENCE

This application is a continuation-in-part of the following commonly-assigned U.S. patent application Ser. No. 14/166,475 filed Jan. 28, 2014 and entitled "Embedded JFETs for High Voltage Applications," which is a continuation of U.S. patent application Ser. No. 13/481,462, filed May 25, 2012, and entitled "Embedded J915FETs for High Voltage Applications;" which applications are hereby incorporated herein by reference.

BACKGROUND

A bootstrap Metal-Oxide-Semiconductor (MOS) device may be used to protect bootstrap circuits. Accordingly, it is able to withstand high operation voltages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
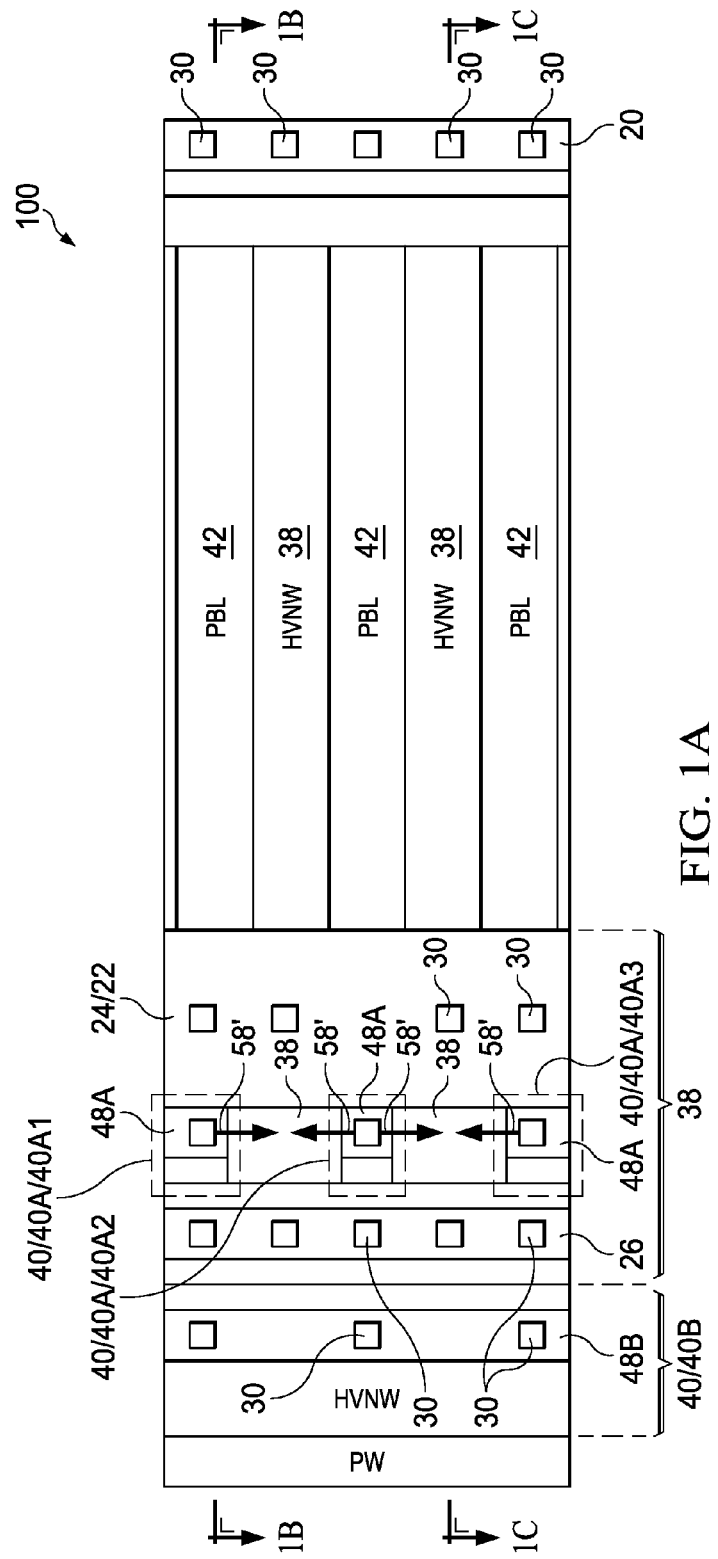
FIGS. 1A through 4C are top views and cross-sectional views of Junction Field-Effect Transistors (JFETs) in accordance with some exemplary embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A high voltage Junction Field-Effect Transistor (JFET) and a high voltage bootstrap Metal-Oxide-Semiconductor (MOS) device are provided in accordance with various exemplary embodiments. The variations and the operation of the embodiments are discussed. Throughout the various views and illustrative embodiments, like reference numbers are used to designate like elements. In the illustrated embodiments, n-type JFETs and n-type bootstrap MOS devices are provided to explain the concept of the embodiments. It is appreciated that the teaching in the embodiments is readily available for the formation of p-type JFETs and p-type bootstrap MOS devices, with the conductivity types of the respective doped regions inverted.

Figure 1B:
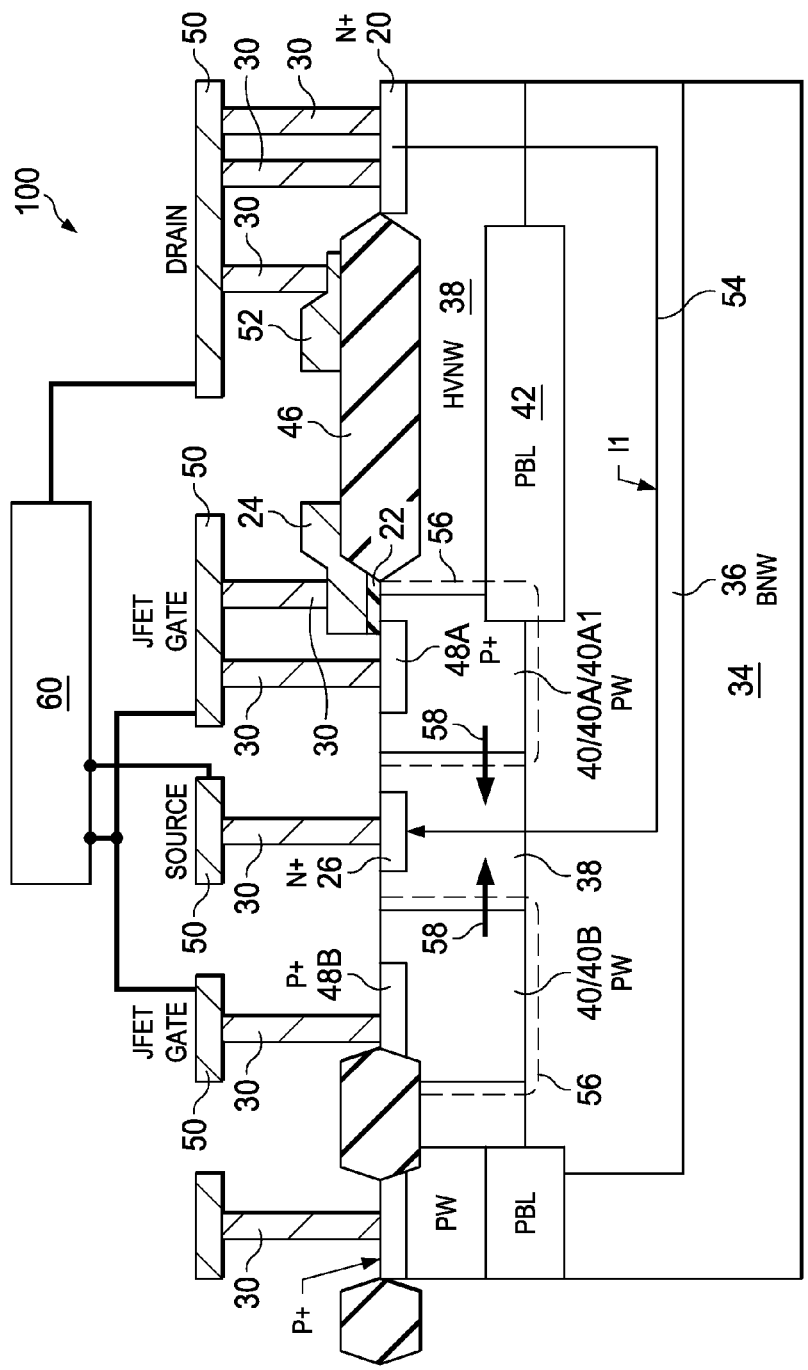
Figure 1C:
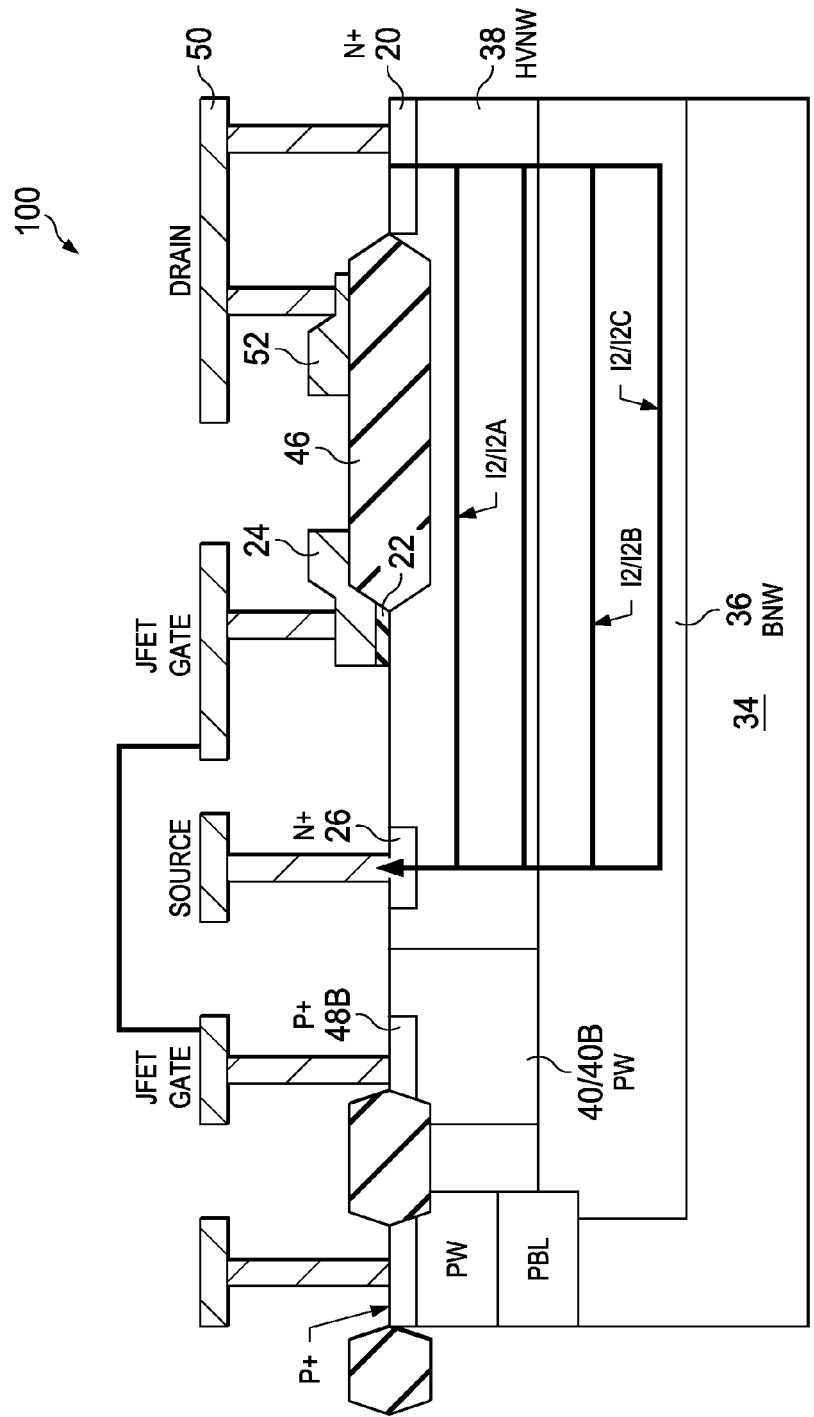

FIGS. 1A through 1C are a top view and cross-sectional views of JFET 100 in accordance with some exemplary embodiments. Referring to FIG. 1A, which is a top view, JFET 100 includes drain region 20, gate electrode 24, and source region 26. Gate electrode 24 is disposed between drain region 20 and source region 26. A plurality of contacts 30 are formed over and electrically couple to the respective underlying drain region 20, gate electrode 24, and source region 26. Furthermore, High-Voltage N-Well (HVNW) 38, P-Wells 40 (including 40A and 40B), and P-type Buried Layers (PBLs) 42 are also included in JFET 100.

FIG. 1B illustrates a cross-sectional view of JFET 100 as shown in FIG. 1A, wherein the cross-sectional view is obtained from the plane crossing line 1B-1B in FIG. 1A. JFET 100 is formed over substrate 34, which may be a p-type substrate, for example, although an n-type substrate may also be used. Buried N-Well (BNW) 36 is formed over substrate 34. In some embodiments, BNW 36 is doped with an n-type impurity to an impurity concentration, for example, between about $10^{14}/cm^3$ and about $10^{17}/cm^3$. Over BNW 36, HVNW 38 and PW regions 40 are formed. HVNW 38 and PW regions 40 may be doped with an n-type impurity and a p-type impurity, respectively, to impurity concentrations about $10^{14}/cm^3$ and about $10^{17}/cm^3$, for example. PBL 42 is formed under HVNW 38 and over BNW 36, and is of p-type. The impurity concentration of PBL 42 may be between about $10^{15}/cm^3$ and about $10^{17}/cm^3$. Drain region 20 and source region 26 are heavily doped (represented by a "+" sign) n-type regions, which may have an n-type impurity concentration greater than about $10^{19}/cm^3$, or between about $10^{19}/cm^3$ and about $10^{21}/cm^3$.

Insulation region 46 is formed over HVNW 38. In some embodiments, insulation region 46 is a field oxide region formed through the oxidation of silicon. In alternative embodiments, insulation region 46 may be a Shallow Trench Isolation (STI) region. A portion of PBL 42 is under and aligned to insulation region 46. The formation of PBL 42 may be used for Reducing Surface electric Field (RESURF), which electric field may be high due to the high voltage applied on drain region 20.

PW regions 40 include PW regions 40A and PW 40B, which are spaced apart from each other by portions of HVNW 38, in which source region 26 is formed. As shown in FIG. 1A, PW regions 40A also includes PW regions 40A1, 40A2, and 40A3, with each connected to one of PBLs 42. Accordingly, when a voltage is applied to PW regions 40A, the voltage may be applied to PBLs 42 through PWs regions 40A. Referring to FIG. 1B, in some embodiments, heavily doped p-type (P+) regions 48A and 48B are formed in PW regions 40A and 40B, respectively. P+ regions 48A and 48B act as the pickup regions of PW regions 40A and 40B, respectively. PW regions 40A and 40B may be electrically interconnected through overlying metal connections, and hence are at a same voltage level during the operation of JFET 100.

Gate dielectric 22 and gate electrode 24 are formed over and aligned to HVNW 38, insulation region 46, and may extend over PW regions 40A. In some embodiments, P+ region 48A and gate electrode 24 are electrically interconnected through contact plugs 30 and one of metal lines 50, so that the same voltage may be applied to gate electrode 24 and P+ regions 48A, and hence to PW regions 40A. Conductive feature 52, which may be formed simultaneously when gate electrode 24 is formed, is over insulation region 46, and may be electrically connected to drain region 20 through contact plugs 30 and one of metal lines 50.

Referring to FIG. 1B, it is observed that there is a current channel between and connected to drain region 20 and source regions 26, wherein the current channel (illustrated as arrow 54) is formed of n-type regions. A first current I1 may flow through current channel 54 and between drain region 20 and source regions 26. The current channel 54 includes the portion of HVNW 38 under drain region 20, BNW 36 (which is under PBL 42), and the portion of HVNW 38 between PW regions 40A and 40B. Voltage source 60 supplies voltages to drain region 20, PW regions 40A/40B, and source region 26. When appropriate voltages are applied to drain region 20, PW regions 40A/40B, and source region 26, current I1 flows through current channel 54. Voltage source 60 may also be configured to adjust the voltages applied on drain region 20, PW regions 40A/40B, and source region 26 to turn off JFET 100. For example, depletion regions 56 are schematically illustrated, which are formed due to the junctions between PW regions 40A/40B and HVNW 38 and BNW 36. By increasing the bias voltages on source region 26, and/or reducing the bias on PW regions 40A and 40B, depletion regions 56 grow in the direction shown by arrows 58. When the bias voltage reaches the pinch-off voltage of JFET 100, depletion regions 56 from opposite sides eventually join with each other. The current channel 54 is thus pinched off by PW regions 40A/40B, and current I1 is turned off. Accordingly, PW regions 40A and 40B may be used to pinch off current I1. It is observed that by adjusting the spacing between PW regions 40A and 40B, the pinch-off voltage may be adjusted.

FIG. 1C illustrates a cross-sectional view of JFET 100 as shown in FIG. 1A, wherein the cross-sectional view is obtained from the plane crossing line 1C-1C in FIG. 1A. FIG. 1C illustrates a second current channel that flows between drain region 20 and source region 26. The current flowing in the second current channel is represented as I2. It is observed that current I2 includes portions I2A, I2B, and I2C. Current portion I2A is in HVNW 38, and is at a level higher than PBL 42 (please refer to FIG. 1B). Current portion I2B is at the same level as PBL 42. Current portion I2C is in BNW 36, and is at the level lower than PBL 42.

Referring back to FIG. 1A, PW portions 40A1, 40A2, and 40A3 also form depletion regions with the surrounding HVNW 38. Similar to the operation of current I1 in FIG. 1B, by increasing the bias voltage on source region 26, and/or reducing the bias voltage on PW regions 40A1, 40A2, and 40A3, the respective depletion regions grow toward each other (and in the direction shown as arrows 58'), and eventually join with each other. The current I2 as in FIG. 1C is thus pinched by PW regions 40A1, 40A2, and 40A3. It is observed that by adjusting the spacing between PW regions 40A1, 40A2, and 40A3, the pinch-off voltage may be adjusted.

As illustrated in FIGS. 1B and 1C, the current between drain region 20 and source region 26 includes current I1 (FIG. 1B) and current I2 (FIG. 1C). Current I1 flows from underlying PW regions 40 upward to reach source region 26. Current I2 flows between neighboring PW regions 40A1, 40A2, and 40A3, and between neighboring PBLs 42. Accordingly, the respective current between source region 26 and drain region 20 is three dimensional. Since the current include both current I1 and current I2, the current may be higher than if there is one of currents I1 and I2.

FIGS. 2A through 4C illustrate top views and cross-sectional views of JFETs 200, 300, and 400 in accordance with alternative embodiments. Unless specified otherwise, the materials and the characteristics of the components in these embodiments are essentially the same as the like components, which are denoted by like reference numerals in the embodiments shown in FIGS. 1A through 1C.

Figure 2A:
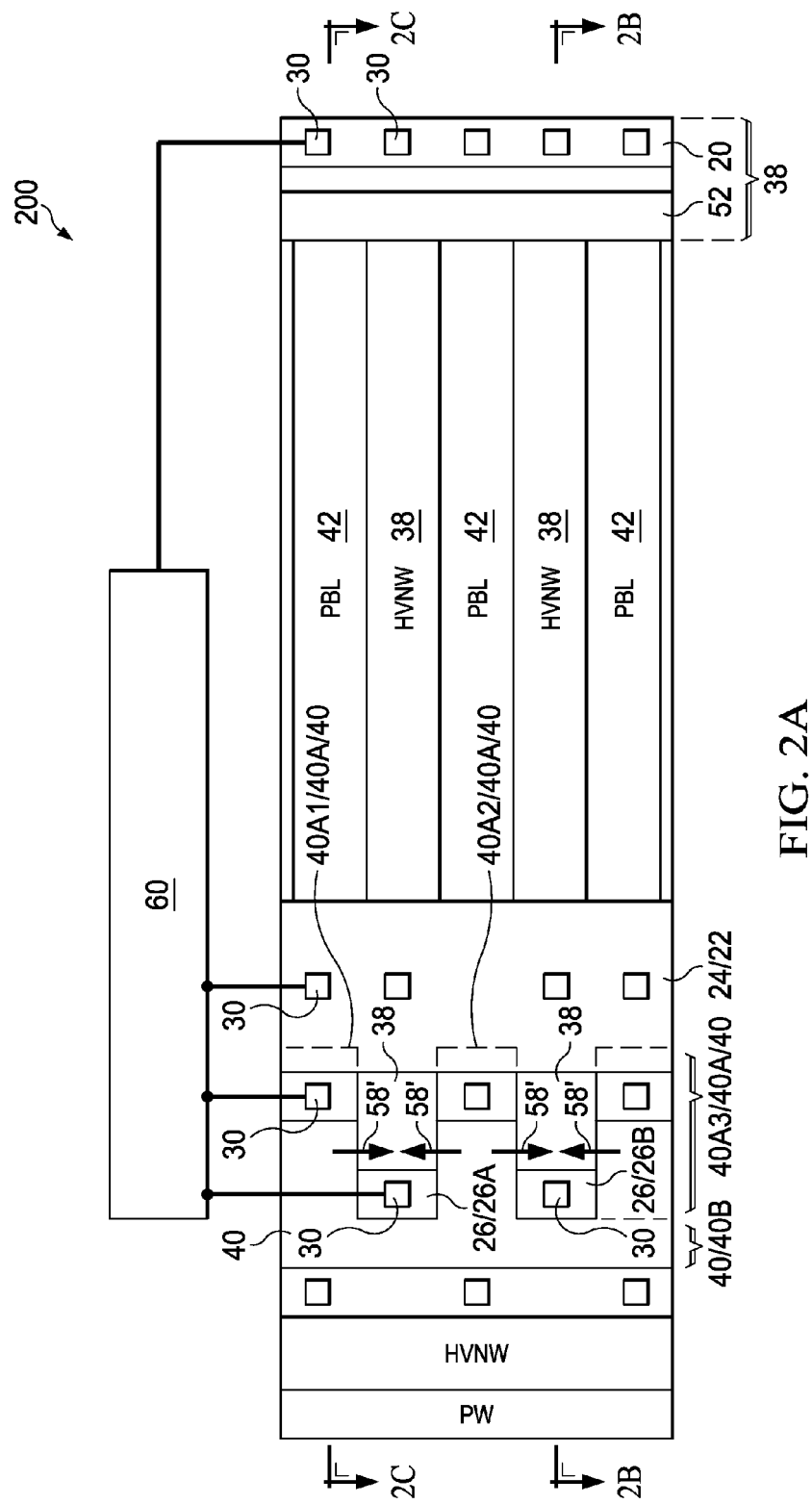

FIG. 2A illustrate a top view of JFET 200. JFET 200 has a similar top view as that of JFET 100 in FIG. 1A, except that the PW regions 40B, 40A1, 40A2, and 40A3 in FIG. 1A are merged with each other to form the continuous PW region 40 in FIG. 2A. Alternatively stated, the PW region 40 as in FIG. 2A may be considered as extending PW regions 40A1, 40A2, and 40A3 in FIG. 1A toward PW region 40B, until PW regions 40A1, 40A2, and 40A3 are merged with PW region 40B. As a result, the continuous source region 26 in FIG. 1A is now broken apart into source regions 26A and 26B. Accordingly, it may be treated as that PW region 40 includes legs 40A1, 40A2, and 40A3 that extend beyond the right edges of source regions 26A and 26B. Similarly, PW legs 40A1, 40A2, and 40A3 may pinch the current I2 (FIG. 2B) flowing from drain region 20 to source regions 26A and 26B, wherein the pinch-off of current I2 is illustrated by arrows 58' in FIG. 2A.

Figure 2B:
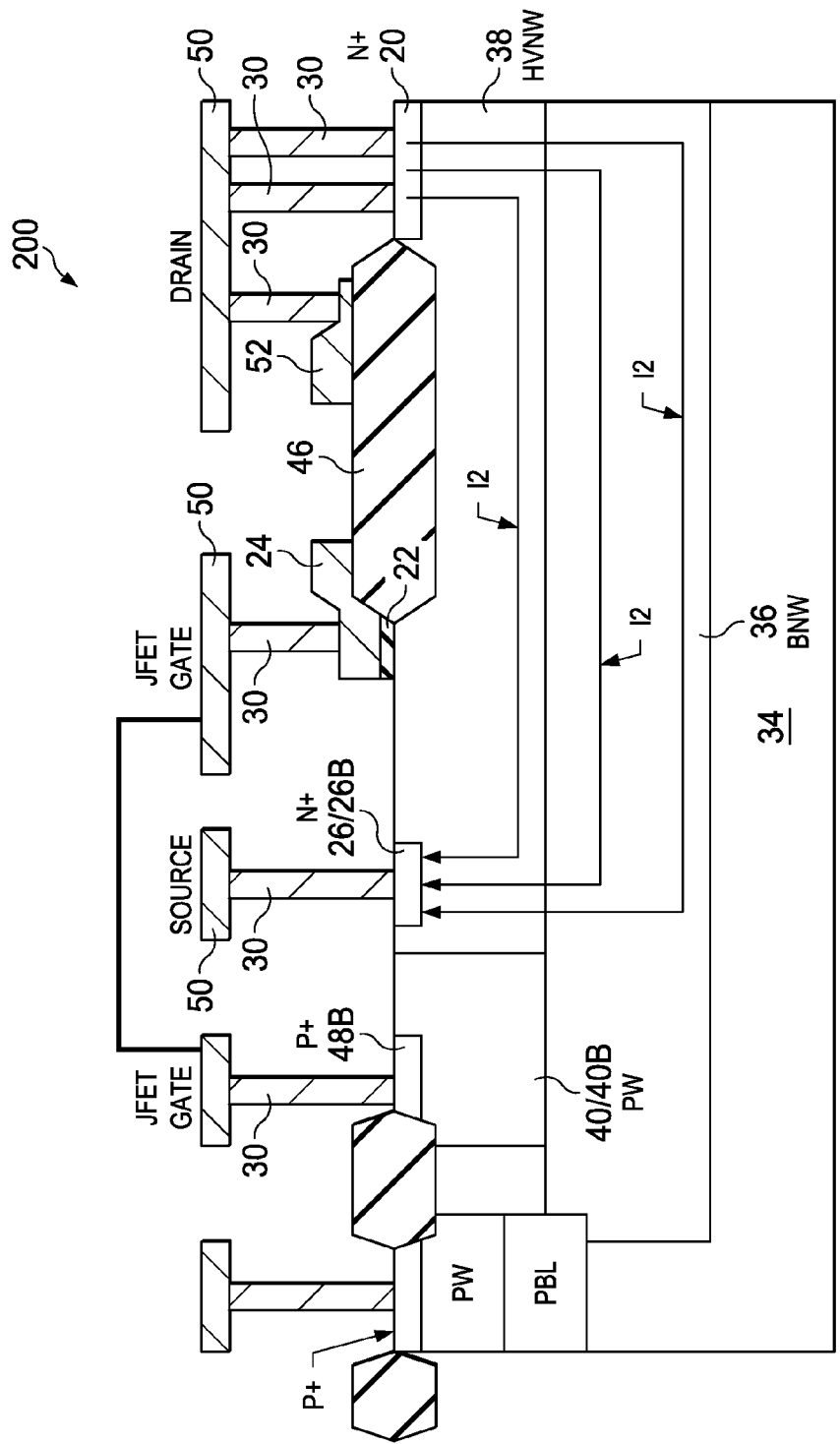

FIG. 2B illustrates a cross-sectional view that is obtained from the plane crossing line 2B-2B in FIG. 2A. It is observed that current I2 includes a portion flowing in HVNW 38, a portion in BNW 36, and a portion at the same level as PBL 42 (FIG. 2C).

Figure 2C:
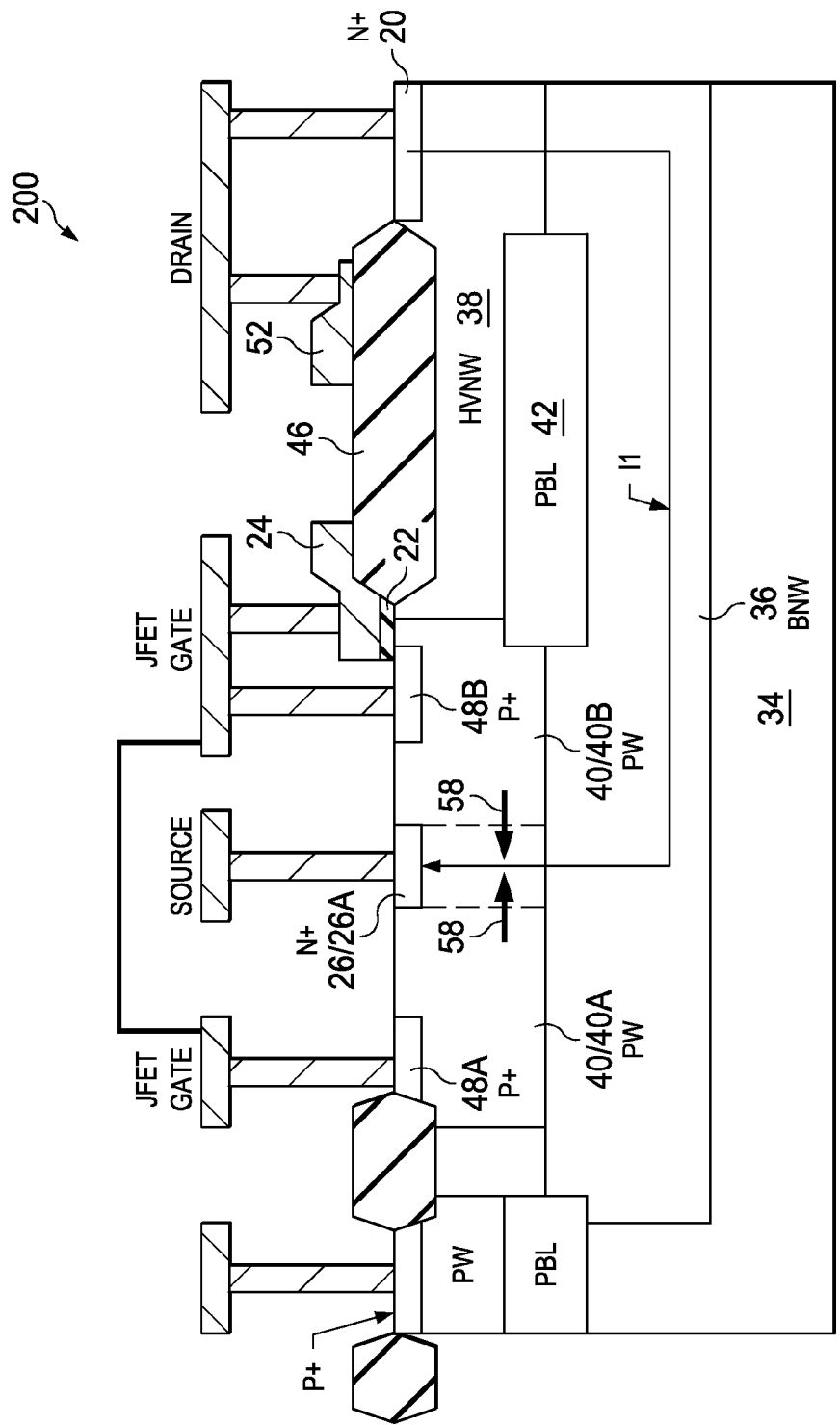

FIG. 2C illustrates a cross-sectional view that is obtained from the plane crossing line 2C-2C in FIG. 2A. As shown in FIG. 2C, current I1 can also flow in BNW 36 and reach source regions 26A and 26B. The pinch-off of current I1 is also achieved through PW region 40, wherein arrows 58 represent the growth direction of the depletion regions that are caused by the pinch-off voltage applied on PW region 40. Accordingly, the on-current of JFET 200, which also include current I1 and current I2, is also high.

Figure 3A:
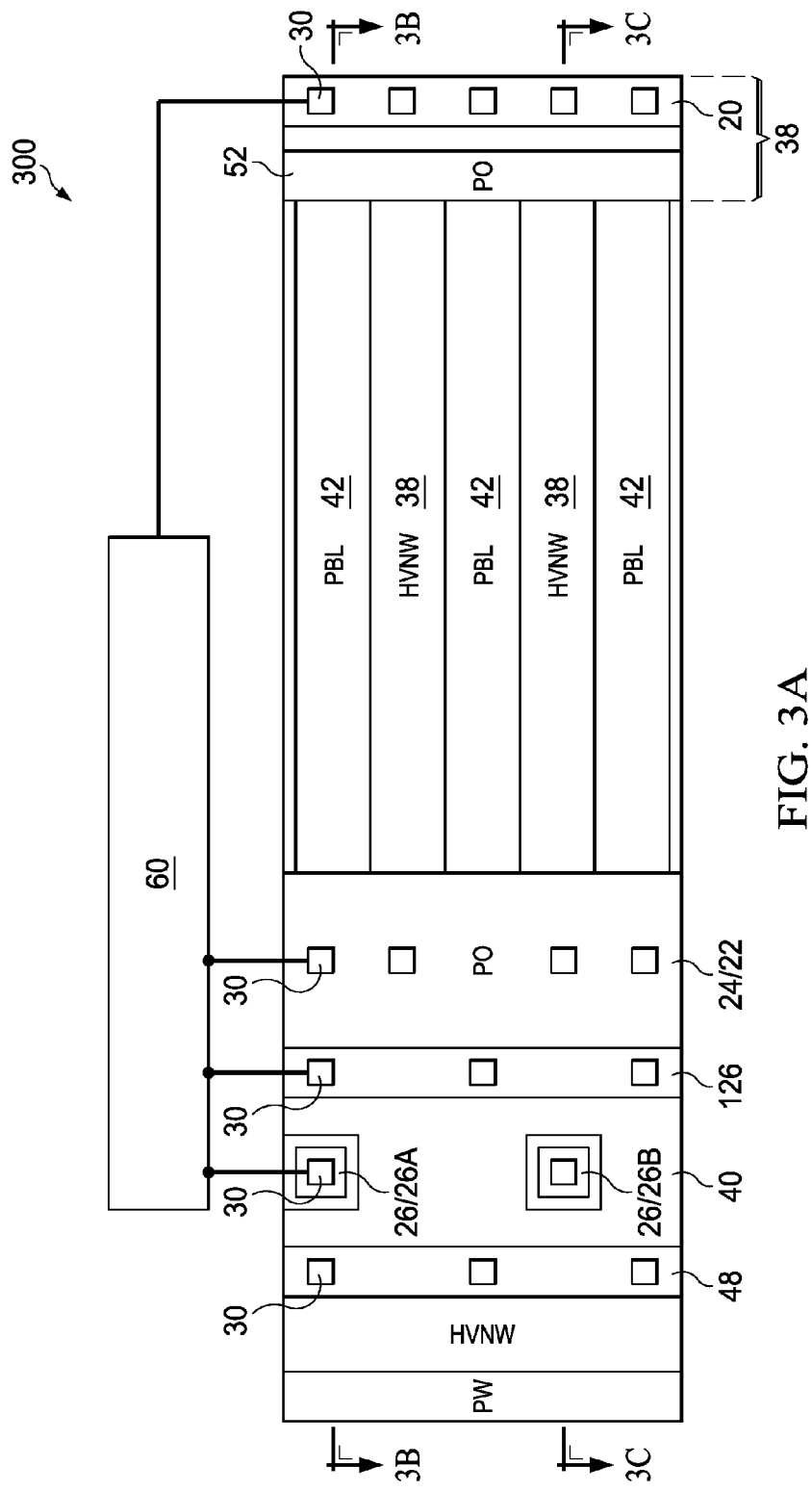

FIG. 3A illustrate a top view of JFET 300. JFET 300 has a similar top view as that of JFETs 100 in FIG. 1A and JFET 200 in FIG. 2A, except that source regions 26A and 26B are fully encircled by PW region 40, which forms a PW ring. Source regions 26A and 26B are also isolated from each other by PW region 40.

Figure 3B:
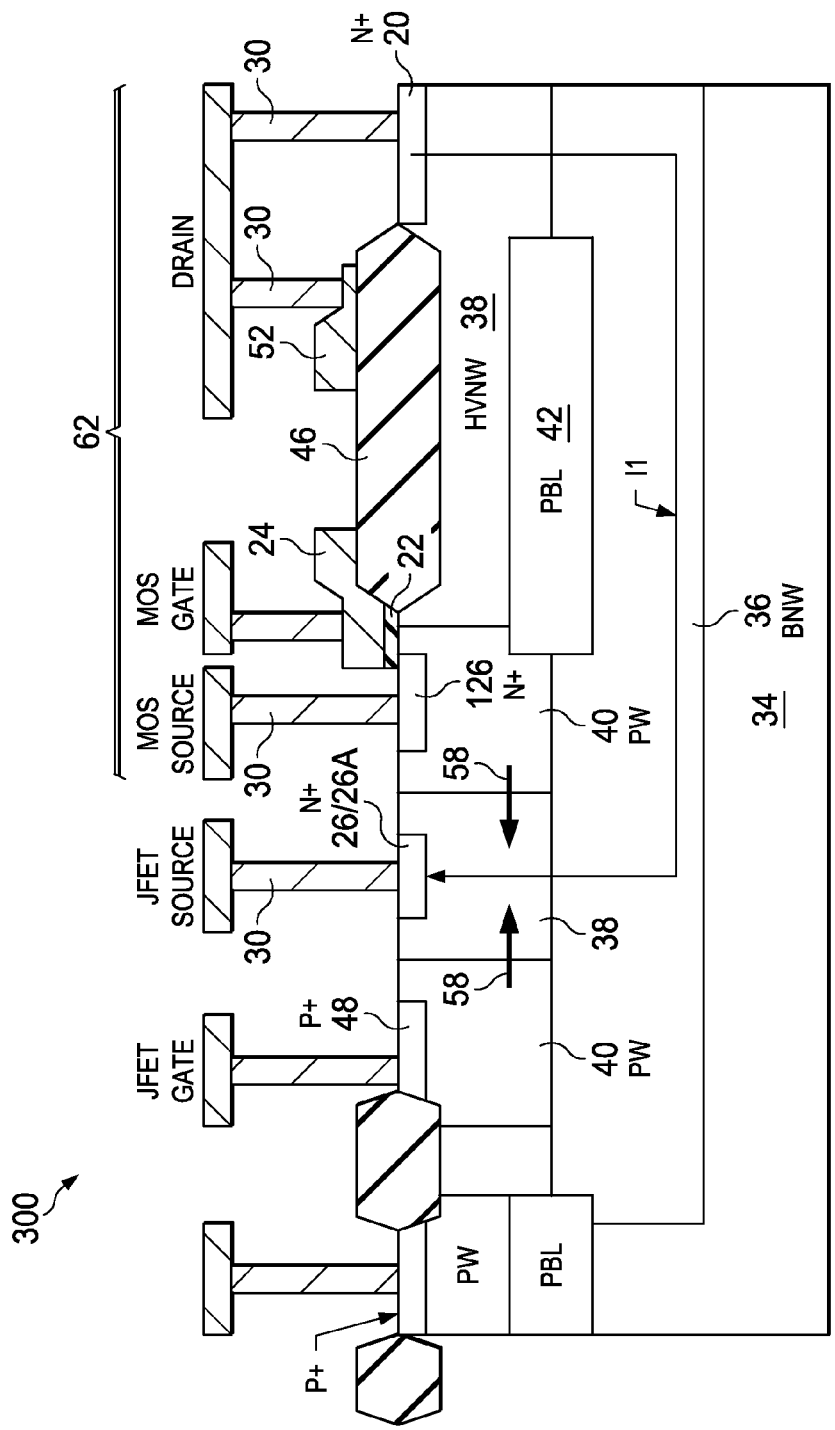

FIG. 3B illustrate a cross-sectional view that is obtained from the plane crossing line 3B-3B in FIG. 3A. As shown in FIG. 3B, current I1 can flow in BNW 36 and reach source regions 26. The pinch of current I1 is achieved through PW region 40, wherein arrows 58 represent the growth direction of the depletion regions that are caused by the voltage applied on PW region 40. The portion of HVNW 38 underlying each of source regions 26A and 26B is also fully encircled by PW region 40. It is observed that by adjusting the top view size of the portions of HVNW 38 that are surrounded by PW 40, the pinch-off voltage of JFET 300 may be adjusted.

Figure 3C:
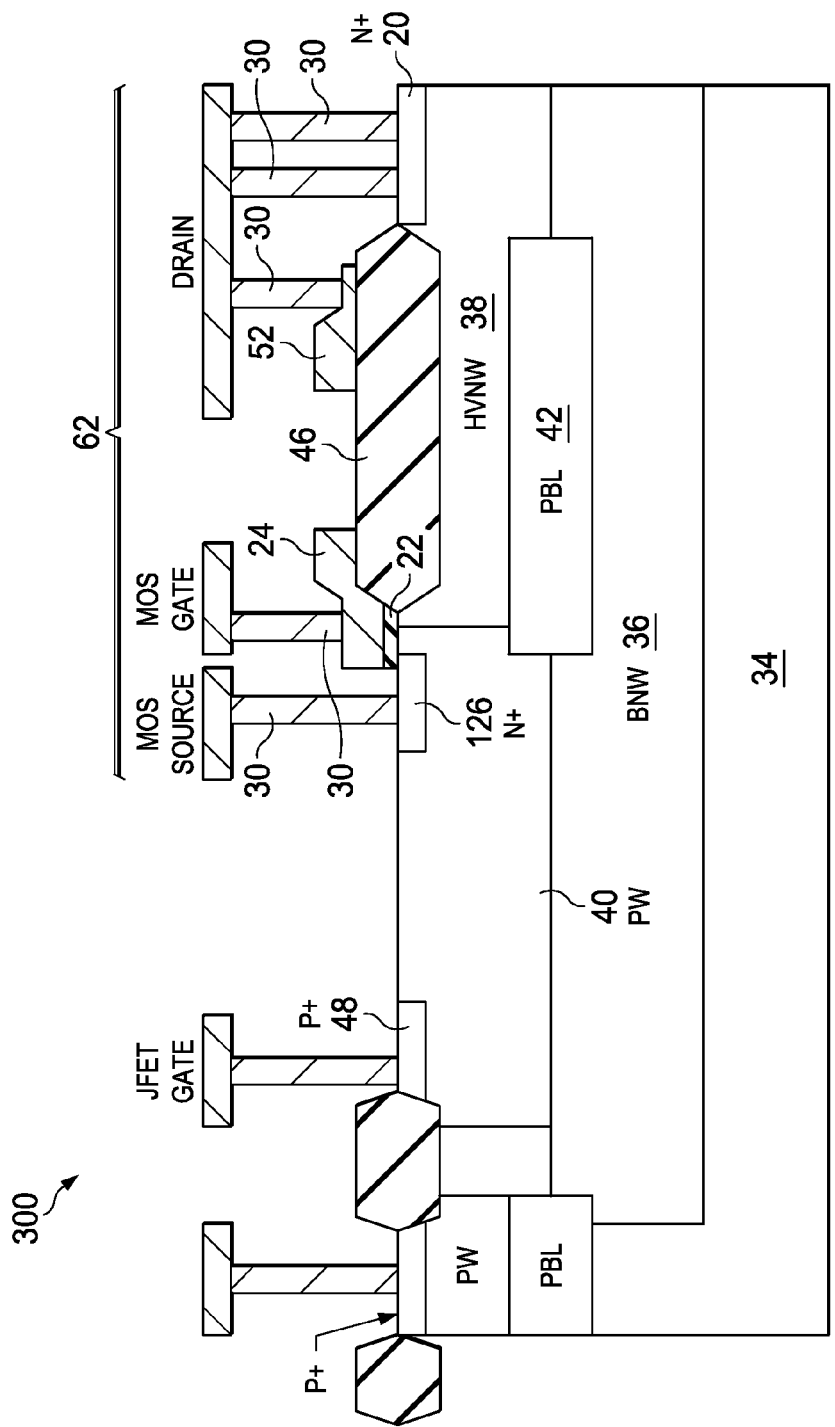

FIG. 3C illustrate a cross-sectional view that is obtained from the plane crossing line 3C-3C in FIG. 3A. It is observed that no source-drain current exists in HVNW 38 and at levels equal to or higher than the level of PBL 42, as symbolized by the "X" sign, since PW region 40 and PBL 42 are on the path of current I2.

FIGS. 3A through 3C also illustrate the decoupling of PW pickup region 47 from gate electrode 24. By electrically decoupling PW pickup region 47 from gate electrode 24, MOS source region 126 may be formed in PW region 40. Different voltages may be applied to PW pickup region 47, MOS source region 126, and gate electrode 24. Accordingly, as shown in FIGS. 3B and 3C, MOS source region 126, gate electrode 24, and drain 20 form the source region, the gate, and the drain region, respectively, of Metal-Oxide-Semiconductor (MOS) transistor 62. Drain region 20 acts as the drain region of both MOS transistor 62 and JFET 300. On the other hand, PW pickup region 47 acts as the gate of JFET 300. The pinch-off or the turning-on of JFET 300 may be achieved by applying appropriate voltages, for example, negative voltages or ground voltages, to PW pickup region 47.

Figure 5:
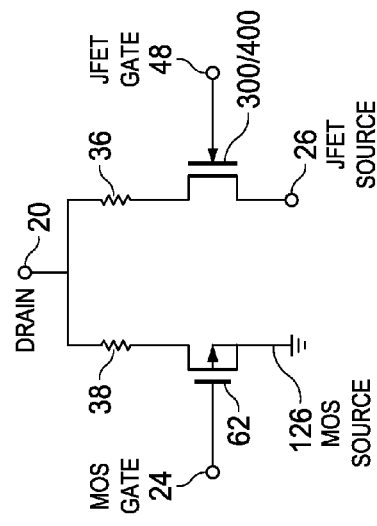
FIG. 5 illustrates an equivalent circuit diagram of the JFET shown in FIGS. 3A through 4C in accordance with some embodiments.

FIG. 5 illustrates an equivalent circuit diagram of the structure shown in FIGS. 3A through 3C, wherein drain region 20, source regions 126 and 26, and gates 24 and 48, of MOS transistor 62 and JFET 300, respectively, are marked. By integrating MOS transistor 62 and JFET 300, the chip area that is used by integrated MOS transistor 62 and JFET 300 in combination may be reduced.

Figure 4A:
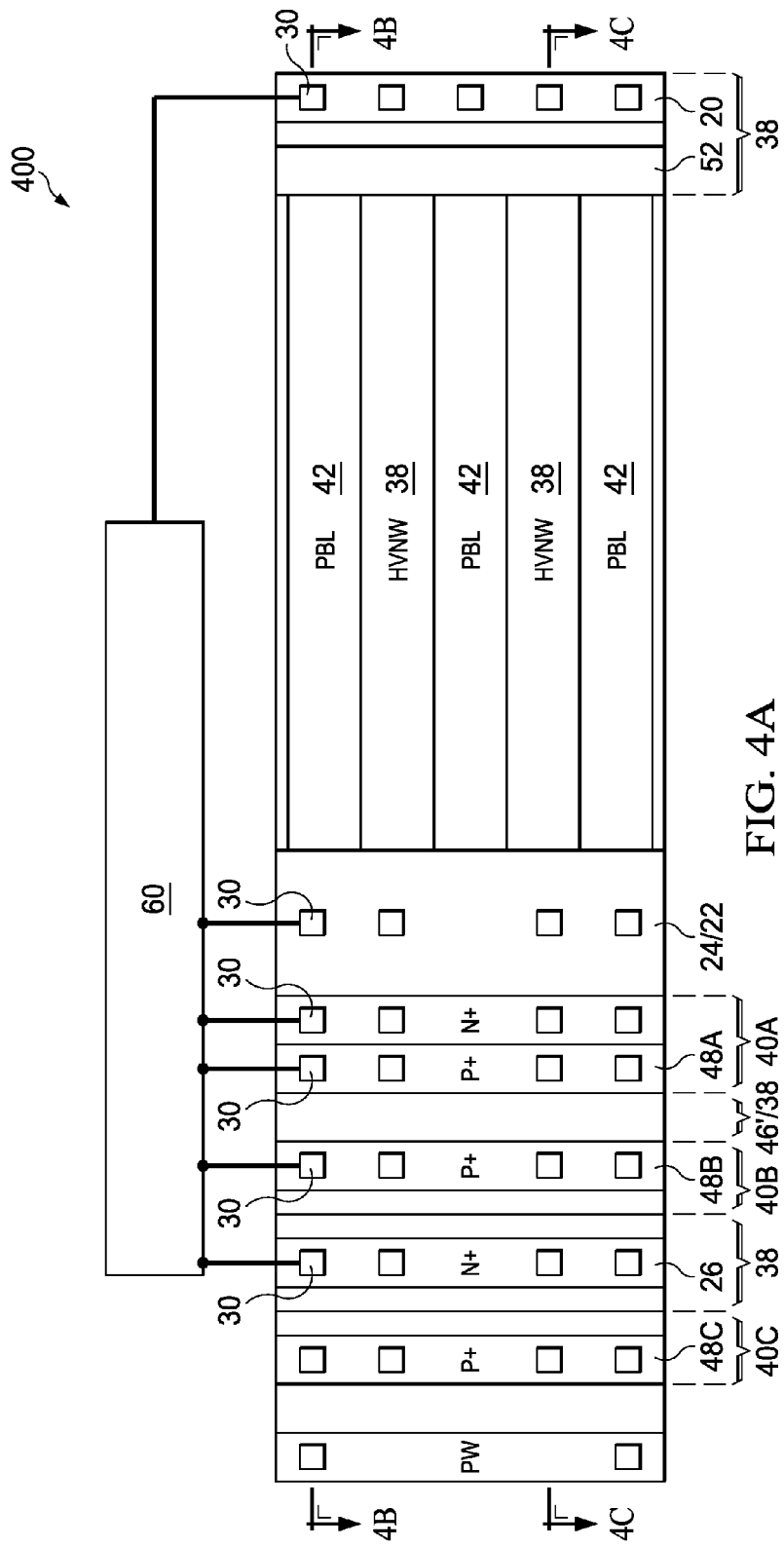

FIG. 4A illustrates a top view of JFET 400. JFET 400 has a similar top view as that of JFET 300 in FIG. 3, except that PW region 40 is separated into PW regions 40A, 40B, and 40C, which are spaced apart from each other by the separated portions of HVNW regions 38. Insulation region 46' (Please refer to FIGS. 4B and 4C) is formed over HVNW region 38 to separate PW region 40A from PW region 40B.

Figure 4B:
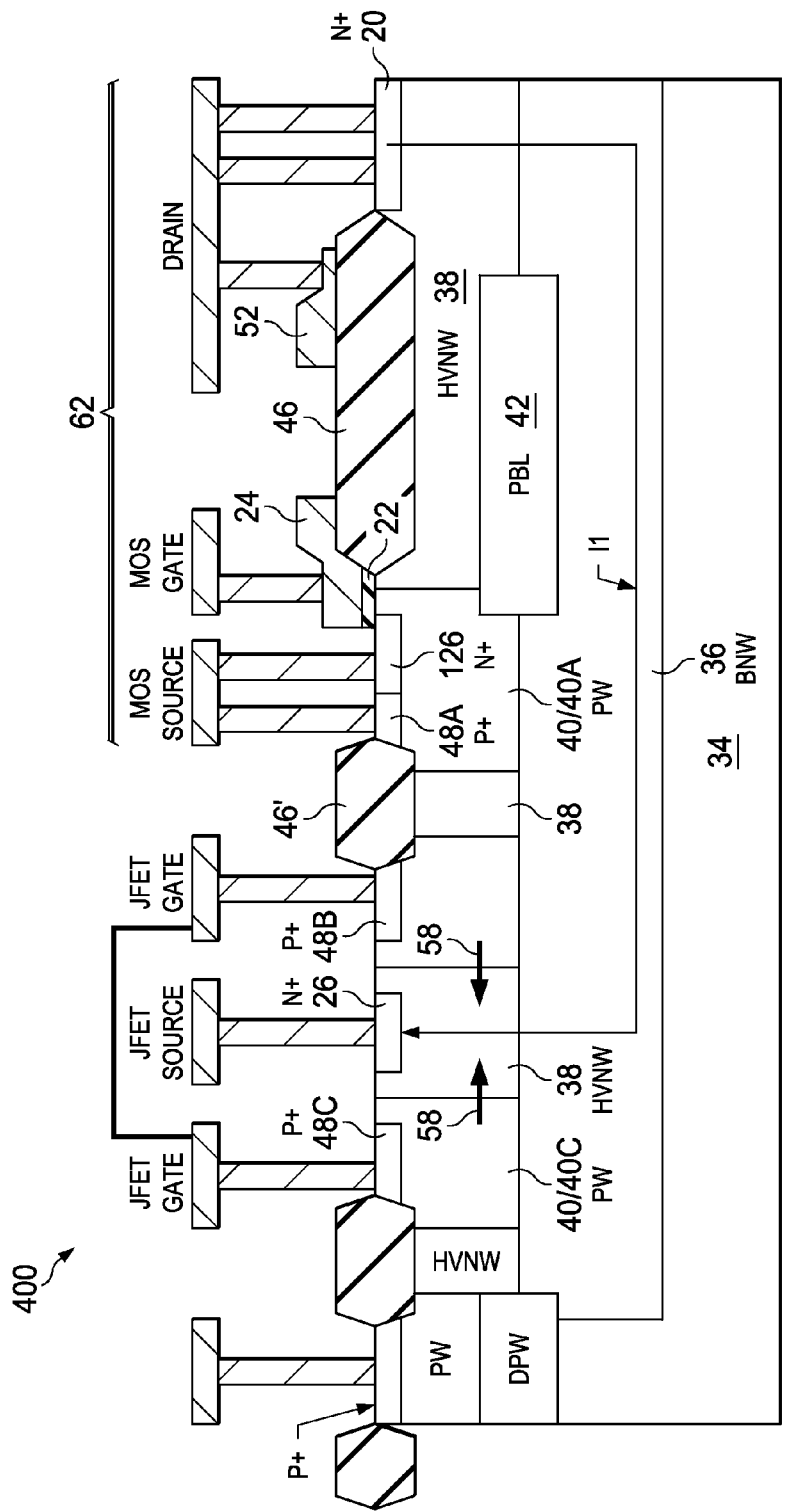
Figure 4C:
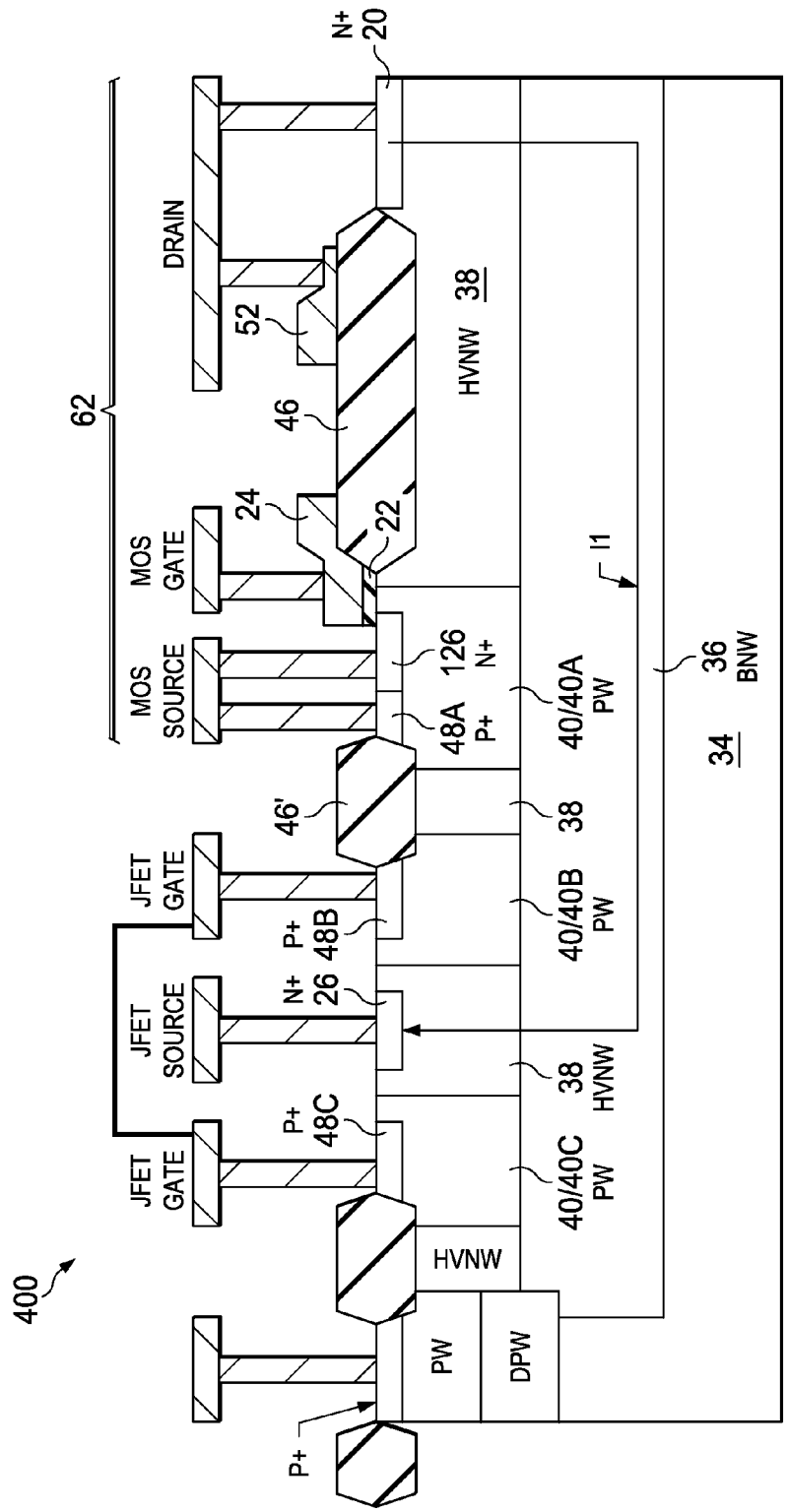

Again, MOS source region 126, gate electrode 24, and drain 20 form the source region, the gate, and the drain region, respectively of MOS transistor 62. Drain region 20 acts as the drain region of both MOS transistor 62 and JFET 400. On the other hand, PW pickup regions 48B and 48C are interconnected to act as the gate of JFET 400. The pinch-off and the turning-on of JFET 400 may be achieved by applying appropriate voltages to PW pickup regions 48B and 48C. When turned on, JFET 400 has current I1 (FIGS. 4B and 4C) that flows under PBL 42, and flows to the source region 26 of JFET 400. Current I1 is illustrated in FIGS. 4B and 4C, which are cross-sectional views obtained from the plane crossing lines 4B-4B and 4C-4C, respectively, in FIG. 4A. An equivalent circuit diagram of the structure in FIGS. 4A through 4C is also illustrated in FIG. 5.

In the embodiments, the pinch-off voltages of the JFETs may be easily adjusted by adjusting the channel width, such as the distances between PW regions 40. The embodiments also provide a solution for a high-voltage JEFT design, with the drain voltage of the JFETs in accordance with embodiment being higher than about 400 V. Due to the use of the 3D channels (for example, referring to currents I1 and I2 in FIGS. 1B and 1C), the turn-on resistance of the JFETs is low.

Figure 6A:
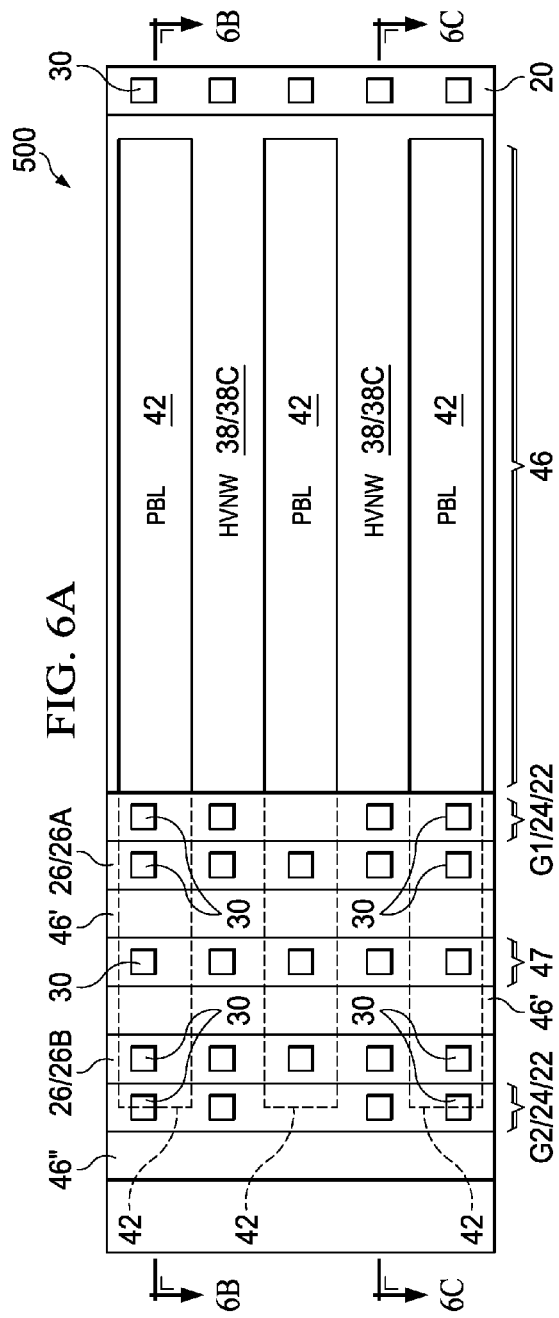
FIG. 6A illustrates a top view of a bootstrap Metal-Oxide-Semiconductor (MOS) device in accordance with some embodiments.
Figure 6B:
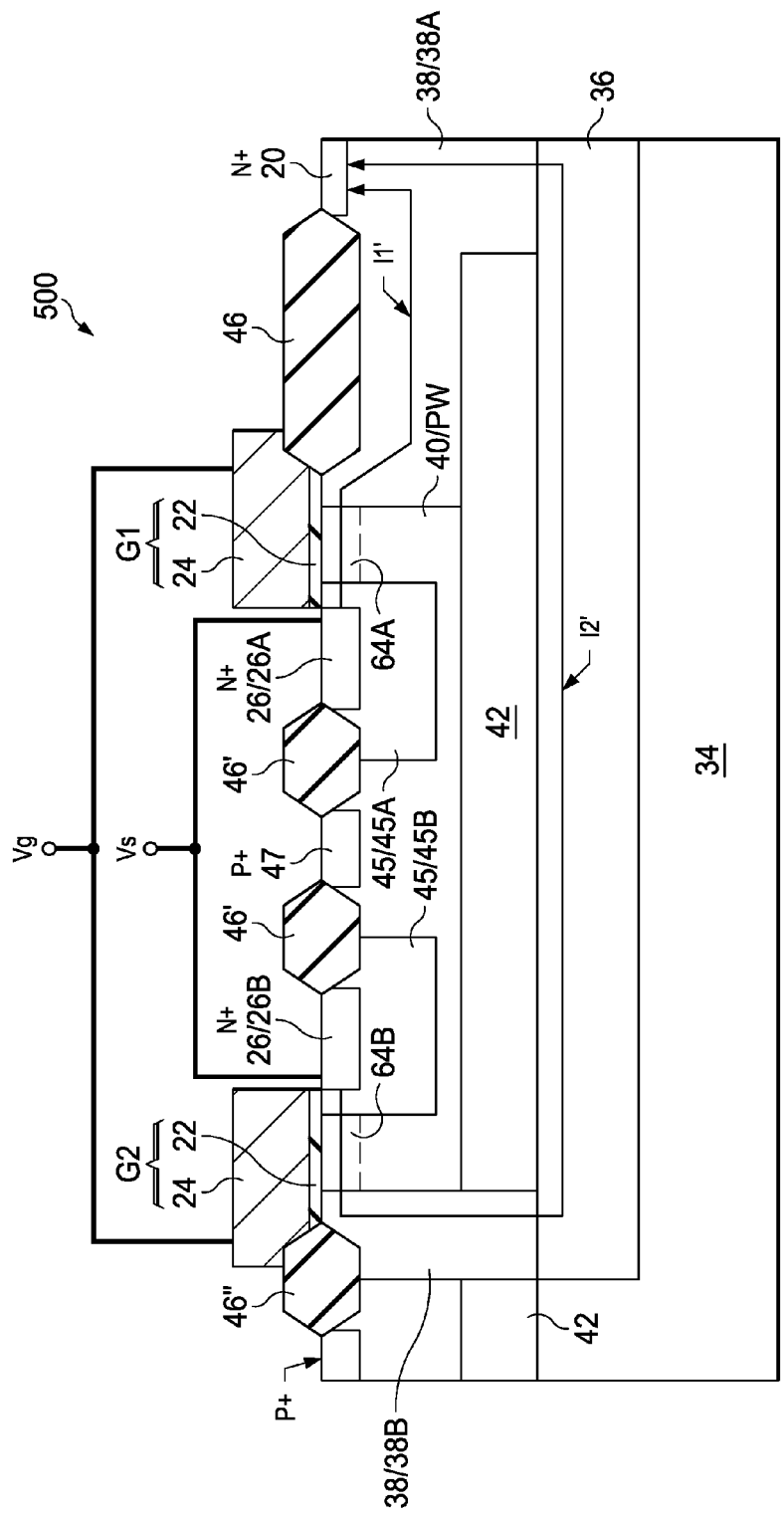
FIGS. 6B and 6C illustrate cross-sectional views of a bootstrap MOS device in accordance with some embodiments.
Figure 6C:
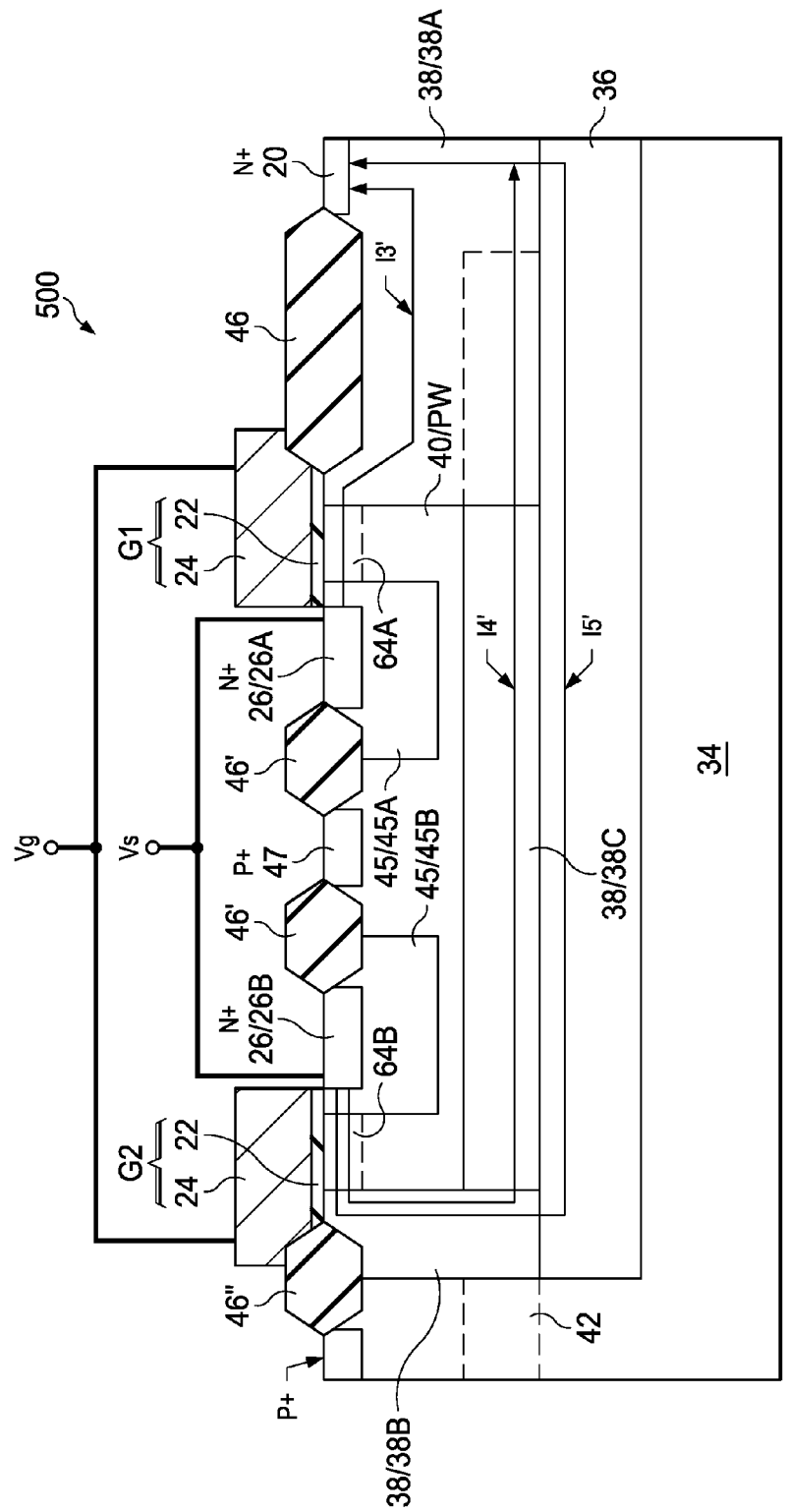

FIGS. 6A, 6B, and 6C illustrate a top view and cross-sectional views of a MOS device in accordance with some embodiments. Unless specified otherwise, the materials and the formation methods of the components in these embodiments are essentially the same as the like components, which are denoted by like reference numerals in the embodiments shown in FIGS. 1 through 4C. The details regarding the materials and formation methods of the components shown in FIGS. 6A, 6B, and 6C may thus be found in the discussion of the embodiments shown in FIGS. 1 through 4C.

Referring to FIG. 6A, which is a top view, MOS device 500 includes drain region 20, gate dielectrics 22, gate electrodes 24, and source regions 26. Gate dielectrics 22 and gate electrode 24 further form gate stacks G1 and G2. Furthermore, HVNW regions 38 and PBLs 42 are also included in MOS device 500. A plurality of contacts 30 are formed over and electrically coupled to the respective underlying drain region 20, gate electrodes 24, and source regions 26, etc.

MOS device 500 may be used as a bootstrap MOS device to protect other circuits (not shown). Accordingly, MOS device 500 is designed to sustain high operation voltages, which may be applied on drain region 20. For example, referring to FIGS. 6B and 6C, insulation region 46 is formed to space drain region 20 apart from gate electrode 24 (in gate stack G1). Gate stack G1 may have a portion overlapping a portion of insulation region 46, while the remaining portion of insulation region 46 is not overlapped by gate electrode 24. Although not illustrated, gate dielectric 22 of gate stack G1 may extend onto the top surface of insulation region 46 in accordance with some embodiments.

Referring to FIGS. 6B and 6C, insulation regions 46' are formed to separate source regions 26 and PW pickup region 47 from each other. Insulation region 46 and 46' may be field oxides, Shallow Trench Isolation (STI) regions, or the like.

In accordance with the embodiments of the present disclosure, as shown in FIGS. 6B and 6C, there are two gate stacks, namely G1 and G2, each comprising a gate dielectric 22 and a gate electrode 24. Gate stack G2 also includes a portion overlapping insulation region 46". Gate stacks G1 and G2 may be electrically interconnected, so that a same gate voltage Vg may be applied on the gate electrodes 24 of gate stacks G1 and G2 simultaneously.

In addition, there are two source regions 26A and 26B physically separated from each other, for example, by PW region 40 and insulation regions 46'. Source regions 26A and 26B may be electrically interconnected, as shown in FIGS. 6B and 6C, so that the same source voltage Vs may be applied on the source regions 26A and 26B simultaneously.

Referring again to FIG. 6A, a plurality of PBLs 42 is formed as strips that are parallel to each other. PBLs 42 are separated from each other by HVNW regions 38C. PBLs 42 and HVNW regions 38C are allocated in an alternating layout, with PBLs 42 having edges contacting the edges of the neighboring HVNW regions 38C. PBLs 42 have the function of RESURF, so that the breakdown voltage of the resulting MOS device 500 is high. As shown in FIGS. 6B and 6C, PBLs 42 extend underlying, and are overlapped by, gate stacks G1 and G2, source regions 26, and PW region 40.

FIG. 6B illustrates a cross-sectional view of the structure in FIG. 6A, wherein the cross-sectional view is obtained in the plane containing line 6B-6B in FIG. 6A. FIG. 6C illustrates a cross-sectional view of the structure in FIG. 6A, wherein the cross-sectional view is obtained in the plane containing line 6C-6C in FIG. 6A. As shown in FIGS. 6B and 6C, BNW region 36, which is of n-type, is formed to extend into, and over a part of, substrate 34. PBL 42 (FIG. 6B) is formed over BNW region 36, wherein the bottom surface of PBL 42 contacts BNW region 36. PW region 40 is formed over PBL 42. The bottom surface of PW region 40 is in contact with the top surface of PBL 42.

PW pickup region 47, which is a P+ region in accordance with some embodiments, is formed in a surface region of PW region 40. Accordingly, a bulk voltage may be applied to PBLs 42 through PW pickup region 47 and PW region 40, which are both p-type regions. In accordance with some embodiments, PW pickup region 47 is applied with voltage VSS, which may be the electrical ground voltage.

HVNW regions 38A and 38B are formed on the opposite sides of PW region 40. HVNW regions 38A and 38B also have their edges contacting the opposite edges of PW region 40. Insulation region 46 may extend from a top surface of HVNW region 38A into HVNW region 38A. HVNW regions 38A and 38B are both in contact with BNW region 36. Accordingly, regions 38A, 38B, and 36 are all of the n-type, and hence form a continuous electrical path for currents to flow through. As shown in FIG. 6B, HVNW regions 38A and 38B are both in contact with PBL(s) 42.

Referring to FIG. 6B, N-Well (NW) regions 45 (including 45A and 45B) are formed in PW region 40. The bottoms of NW regions 45 are spaced apart from the top surface of PBL 42 by a bottom portion of PW region 40. In accordance with some exemplary embodiments, NW regions 45 are doped with an n-type impurity to an impurity concentration, for example, between about $10^{14}/cm^3$ and about $10^{17}/cm^3$. Source regions 26A and 26B, which are heavily doped N-type (N+) regions, are formed in the top surface portions of the respective NW regions 45. NW regions 45, due to their relatively low n-type impurity concentration, have the function of increasing the breakdown voltage of the respective MOS device 500.

As shown in FIG. 6C, HVNW 38C is formed over BNW region 36. HVNW 38C interconnects HVNW regions 38A and 38B, so that HVNW regions 38A, 38B, and 38C are all of the n-type, and form a continuous electrical path for currents to flow through. PBL 42 is also illustrated in FIG. 6C to show its position. Since PBL 42 is not in the illustrated plane, it is shown using dashed lines. PW region 40 is formed over HVNW region 38C, and a bottom portion of PW region 40 spaces HVNW region 38C apart from NW regions 45A and 45B.

When a low gate voltage Vg is applied on gates G1 and G2, MOS device 500 is turned off Referring to FIG. 6B, when gate voltage Vg is higher than the threshold voltage of MOS device 500, and a positive source voltage Vs is applied on source regions 26A and 26B, the channel regions 64A and 64B in PW region 40, which channel regions are under gate stacks G1 and G2, respectively, are thus inverted, and currents I1' and I2' are generated in the plane shown in FIG. 6B. Current IF flows through source region 26A, NW region 45A, channel region 64A, HVNW region 38A, and flows into drain region 20. Current I2' flows through source region 26B, NW region 45B, channel region 64B, HVNW region 38B, BNW region 36, HVNW region 38A, and flows into drain region 20.

Referring to FIG. 6C, when gate voltage Vg is higher than the threshold voltage of MOS device 500, and a positive source voltage Vs is applied on source regions 26A and 26B, currents I3', I4', and I5' are generated in the plane shown in FIG. 6C. Current I3' flows through source region 26A, NW region 45A, channel region 64A, HVNW region 38A, and flows into drain region 20. Current I4' flows through source region 26B, NW region 45B, channel region 64B, HVNW region 38B, HVNW region 38C, HVNW region 38A, and flows into drain region 20. Current I5' flows through source region 26B, NW region 45B, channel region 64B, HVNW region 38B, BNW region 36, HVNW region 38A, and flows into drain region 20.

The embodiments of the present disclosure have some advantageous features. Combing FIGS. 6B and 6C, it is observed that when MOS device 500 is turned on, the currents include the portions (I1' and I2' in FIG. 6B and I3' and I5' in FIG. 6C) that flow overlying and underlying PBLs 42, and the portions (current I4' in FIG. 6C) that flows between, and at a same level as, PBL 42. Accordingly, 3D current channels are formed. As a result, the turn-on resistance of the MOS device 500 is low. In addition, PBLs 42 are formed, so that the RESURF effect is resulted, and the breakdown voltage of MOS device 500 is increased, making it suitable for high-voltage applications such as bootstrap diodes.

In accordance with some embodiments of the present disclosure, a device includes a buried well region of a first conductivity type, a HVW region of the first conductivity type over the buried well region, and a well region of a second conductivity type opposite to the first conductivity type. The well region has an edge contacting an edge of the HVW region. The device further includes a drain region of the first conductivity type in a surface portion of the HVW region, a source region of the first conductivity type in a surface portion of the well region, and a gate electrode over the HVW region and the well region, with the drain region and the source region on opposite sides of the gate electrode, a plurality of buried regions of the second conductivity type. The plurality of buried regions is parallel to each other, and is over and contacting a top surface of the buried well region. A plurality of HVW regions of the first conductivity type separates the plurality of buried regions from each other. The plurality of buried regions and the plurality of HVW regions are spaced apart from the source region by the well region.

In accordance with alternative embodiments of the present disclosure, a device includes an n-type buried well region, a PBL over and contacting the n-type buried well region, a p-well region over and contacting the PBL, and a first n-well region and a second n-well region in a top portion of the p-well region. The first n-well region and the second n-well region are separated from each other by the p-well region. The device further includes a first n-type source region and a second n-type source region in the first n-well region and the second n-well region, respectively, and a first HVNW region and a second HVNW region contacting opposite edges of the p-well region. A first gate stack overlaps a portion of the p-well region and a portion of the first HVNW region. A second gate stack overlaps a portion of the p-well region and a portion of the second HVNW region.

In accordance with yet alternative embodiments of the present disclosure, a device includes a p-well region, and a first High-Voltage N-type Well (HVNW) region and a second HVNW region contacting opposite edges of the p-well region. A P-type Buried Layer (PBL) has opposite edges in contact with the first HVNW region and the second HVNW region. An n-type buried well region is underlying the PBL. The p-well region and the n-type buried well region are in contact with a top surface and a bottom surface, respectively, of the PBL. The device further includes a n-well region in a top portion of the p-well region, an n-type source region in the n-well region, a gate stack overlapping a portion of the p-well region and a portion of the second HVNW region, and a channel region under the gate stack. The channel region interconnects the n-well region and the second HVNW region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a buried well region of a first conductivity type;
   a first High-Voltage Well (HVW) region of the first conductivity type over the buried well region;
   a first well region of a second conductivity type opposite to the first conductivity type, wherein the first well region comprises an edge contacting an edge of the first HVW region;
   a drain region of the first conductivity type in a surface portion of the first HVW region;
   a first source region of the first conductivity type in a surface portion of the first well region;
   a first gate electrode over the first HVW region and the first well region, with the drain region and the first source region on opposite sides of the first gate electrode;
   a plurality of buried regions of the second conductivity type, wherein the plurality of buried regions is parallel to each other, and is over and contacting a top surface of the buried well region; and
   a plurality of HVW regions of the first conductivity type separating the plurality of buried regions from each other, wherein the plurality of buried regions and the plurality of HVW regions are spaced apart from the first source region by the first well region.

2. The device of claim 1 further comprising a second well region in an upper portion of the first well region, wherein the second well region is spaced apart from the plurality of buried regions and the plurality of HVW regions by a bottom portion of the first well region.

3. The device of claim 2, wherein the second well region overlaps the plurality of buried regions and the plurality of HVW regions.

4. The device of claim 1 further comprising:
   a second source region of the first conductivity type in an additional surface portion of the first well region, wherein the first source region and the second source region are spaced apart from each other by a portion of the first well region.

5. The device of claim 4 further comprising:
   a second gate electrode overlapping the first well region, wherein the first gate electrode is electrically connected to the second gate electrode; and
   a second HVW region with a portion overlapped by the second gate electrode, wherein the first HVW region and the second HVW region are on opposite sides of, and are connected by, the plurality of HVW regions, wherein the second HVW region is in contact with the buried well region.

6. The device of claim 4, wherein the first source region and the second source region are electrically interconnected.

7. The device of claim 1 further comprising a pickup region of the second conductivity type in a top portion of the first well region.

8. A device comprising:
   an n-type buried well region;
   a first P-type Buried Layer (PBL) over and contacting the n-type buried well region;
   a p-well region over and contacting the first PBL;
   a first n-well region and a second n-well region in a top portion of the p-well region, wherein the first n-well region and the second n-well region are separated from each other by the p-well region;
   a first n-type source region and a second n-type source region in the first n-well region and the second n-well region, respectively;
   a first HVNW region and a second HVNW region contacting opposite edges of the p-well region;
   a first gate stack overlapping a portion of the p-well region and a portion of the first HVNW region; and
   a second gate stack overlapping a portion of the p-well region and a portion of the second HVNW region.

9. The device of claim 8 further comprising a drain region in the first HVNW region, wherein the first n-type source region, the second n-type source region, the first gate stack, and the second stack are comprised in a same Metal-Oxide-Semiconductor (MOS) device.

10. The device of claim 8, wherein the first n-well region and the second n-well region are spaced apart from the first PBL by a bottom portion of the p-well region.

11. The device of claim 8 further comprising a third HVNW region over and contacting the n-type buried well region, wherein the third HVNW region connects the first HVNW region to the second HVNW region, and wherein the third HVNW region is spaced apart from the first n-well region and the second n-well region by a bottom portion of the p-well region.

12. The device of claim 11, wherein the third HVNW region comprises an edge contacting an edge of the first PBL.

13. The device of claim 11 further comprising a second PBL, wherein the first PBL and the second PBL are in contact with opposite edges of the third HVNW region.

14. The device of claim 8 further comprising a heavily doped p-well pickup region between the first n-type source region and the second n-type source region.

15. The device of claim 8, wherein the first n-type source region and the second n-type source region are electrically interconnected, and the first gate stack and the second gate stack are electrically interconnected.

16. The device of claim 8, wherein the first HVNW region and the second HVNW region contact the n-type buried well region.

17. A device comprising:
    a p-well region;
    a first High-Voltage N-type Well (HVNW) region and a second HVNW region contacting opposite edges of the p-well region;
    a P-type Buried Layer (PBL) having opposite edges in contact with the first HVNW region and the second HVNW region;
    a n-type buried well region underlying the PBL, wherein the p-well region and the n-type buried well region are in contact with a top surface and a bottom surface, respectively, of the PBL;
    a first n-well region in a top portion of the p-well region;
    a first n-type source region in the first n-well region;
    a first gate stack overlapping a portion of the p-well region and a portion of the second HVNW region; and
    a first channel region under the first gate stack, wherein the first channel region interconnects the first n-well region and the second HVNW region.

18. The device of claim 17, wherein the first HVNW region and the second HVNW region are interconnected through an electrical path, with an entirety of the electrical path consisting of n-type regions.

19. The device of claim 18, wherein the n-type buried well region is in physical contact with the first HVNW region and the second HVNW region.

20. The device of claim 17 further comprising:
    a second n-well region in a top portion of the p-well region, wherein the first n-well region and the second n-well region are separated from each other by a portion of the p-well region;

a second n-type source region in the second n-well region;
a second gate stack overlapping a portion of the p-well region and a portion of the first HVNW region; and
a second channel region under the second gate stack, wherein the second channel region interconnects the second n-well region and the first HVNW region.

\* \* \* \* \*